Sept. 8, 1970 C. L. WRIGHT ET AL 3,527,665
COPPER-CLAD LAMINATES OF UNSATURATED THERMOSETTING RESINS WITH COPPER LAYER COATED WITH POLYPHENYLENE OXIDE RESIN
Filed Jan. 23, 1967
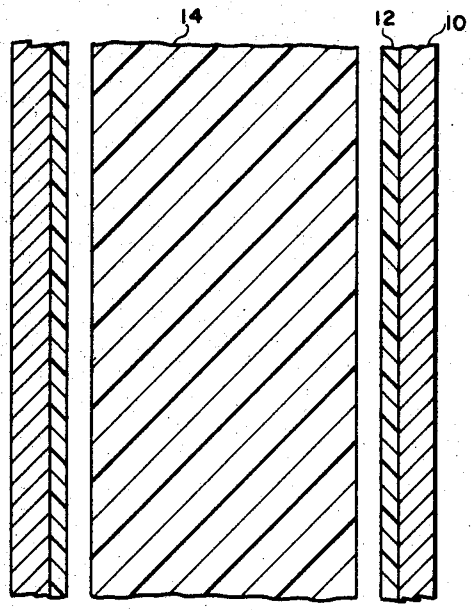
INVENTORS
CARL L. WRIGHT
HARRY H. BEACHAM
BY [signatures]

United States Patent Office 3,527,665

Patented Sept. 8, 1970

3,527,665

COPPER-CLAD LAMINATES OF UNSATURATED THERMOSETTING RESINS WITH COPPER LAYER COATED WITH POLYPHENYLENE OXIDE RESIN

Carl L. Wright, Pasadena, and Harry H. Beacham, Severna Park, Md., assignors to FMC Corporation, New York, N.Y., a corporation of Delaware Filed Jan. 23, 1967, Ser. No. 610,751
Int. Cl. B32b *15/04*
U.S. Cl. 161—92 6 Claims

ABSTRACT OF THE DISCLOSURE

This specification discloses the production of copper-clad laminates useful in the field of printed circuitry which are made by baking a film of polyphenylene oxide resin onto the copper to be laminated and then laminating the resultant product to a base containing a thermosetting resin of the class consisting of diallyl phthalate resin and unsaturated polyesters. In order to get the desired result it is necessary to use a specific polymerization catalyst—to wit, dicumyl peroxide.

BACKGROUND OF THE INVENTION

Field of the invention

This invention is concerned with the production of copper-clad laminates useful in the field of printed circuitry and is intended to provide laminates of this character which are both cheaper than and have substantially better properties than those heretofore available.

Description of prior art

There has been considerable development in the past two decades in the development of the type of electric circuits which are generally known as printed circuitry. Printed circuits are made from blanks comprising one or more sheets of copper laminated to one or both sides of a base material which has good electrical resistance and impedance. It is essential in these blanks that the bond between the copper and the base material be sufficiently strong to withstand the various treatments to which the blanks are subjected, which generally include the application of a resist to the outside surface of the copper, the development of the circuit design in the resist, the etching away of the copper with a material such as ferric chloride or ammonium persulfate, the thermal stress of the soldering which is used in making the connections, and the application of the desired connecting wires and the mechanical handling of the printed circuit board thereafter.

Because of this copper binding problem, many of the more desirable resins from the viewpoint of electrical properties have not heretofore been used in this industry. The only two classes which have found wide acceptance have been the bisphenol epoxy resins and the phenol formaldehyde resins, both generally used in combination with glass mats. The epoxy resins are expensive and have rather poor eletcrical characteristics and poor high temperature properties, in that they lose rigidity and tend to creep. The phenolic resins are much cheaper, but electricals are even poorer than those of the epoxy resins, and they tend to degrade badly in relatively high temperature uses. Both of these sorts of resins have deficiencies in dimensional stability. Finally, both of these sorts of resins, under certain conditions, produce fumes which attack the copper and cause trouble in use.

One of the relatively new classes of resins, the high temperature thermoplastic polyphenylene oxides, has been suggested for this use. Unfortunately they are thermoplastic at high temperatures and thus cannot be used for high temperature applications and they lack dimensional stability even at relatively low temperatures. In addition laminates of this type are expensive.

The diallyl phthalates are a group of resins known to have electrical properties which suit them ideally for printed circuits. They have excellent electrical properties wet and dry, they are dimensionally stable, and are operable at relatively high temperatures. Moreover they have excellent chemical resistance and are free of corrosive elements. Unfortunately they do not adhere to copper.

Some of the unsaturated polyester resins, while not as satisfactory as the diallyl phthalates, would none-the-less be useful for less exacting requirements in this area and are somewhat cheaper than the diallyl phthalates. Unfortunately they too do not adhere to copper and thus have not found any acceptance in this area of use.

SUMMARY OF THE INVENTION

We have discovered that it is possible to produce copper-clad laminates with excellent electrical properties and at costs which are competitive or somewhat lower than those of the prior art materials, using diallyl phthalates and unsaturated polyesters as the base resins. In accordance with this invention we coat copper sheets with a thin film fo polyphenylene oxide resin and then heat the coated copper to a temperature between about 100° C. and 170° C. for from about 5 to 30 minutes, catalyzing the system either with air or preferably by incorporating in the composition dicumyl peroxide. The coated copper is then laminated under heat and pressure to a base containing a diallyl phthalate polymer or an unsaturated polyester or mixtures thereof, the base containing dicumyl peroxide as the polymerizing catalyst to thermoset the resin. Under these conditions excellent bonds are obtained between the clad copper and the base material.

BRIEF DESCRIPTION OF DRAWING

The drawing attached hereto shows in schematic form a cross section of a laminated sandwich in process of production.

DESCRIPTION OF PREFERRED EMBODIMENTS OF THE INVENTION

Referring to the drawing, sheets of copper 10, generally of the order of a few mils in thickness, are coated with films 12 of polyphenylene oxide resins under the conditions to be hereunder described and are combined to form a sandwich with a base material 14 which generally comprises a fibrous mat or cloth impregnated with a special resin composition which will be hereinafter defined. On application of heat and pressure to the lay-up as demonstrated in the drawing, the desired laminates of this invention are produced.

As indicated above the copper sheets used are of the type of copper conventionally used in this area, preferably a good electrical grade whose thickness is dictated by the particular construction involved and is ordinarily of a few mils in thickness. This copper is prepared for use in the process by coating onto one surface thereof a film of polyphenylene oxide in any conventional fashion, more preferably by knife or roller coating a solution of the resin in an appropriate solvent. Resins of this type are available on the market; for example, they can be made in accordance with the disclosure of British Pat. 1,006,886 issued to General Electric Company on Oct. 6, 1965. Any resin of this type can be used although best results are obtained by a variety sold on the market as Noryl and which is distinguished by the fact that it is the most fluid of these resins at cure temperatures for the resins used in the substrate. The dry film thickness of the polyphenylene oxide should be preferably of the order of a mil in thickness; films of even under a one-half mil have proven very satisfactory.

However, in order to get a good bond in the laminating operation, it is essential that the polyphenylene oxide resin film be baked in the presence of a catalyst at temperatures of about 100–170° C. for a period of about 5 to 30 minutes, the longer times being needed for the lower temperatures. Baking below about 100° C. or for too short a time or at too high a temperature results in deterioration of the bond of the polyphenylene oxide resin to copper and should be avoided.

The catalyst used in the baking operation may be air supplied from the outside, but much better control is obtainable by the inclusion of the specified catalyst, dicumyl peroxide, in the composition. About one percent of this catalyst based on the weight of polyphenylene oxide resin is generally sufficient particularly where the baking is done in air. Higher percents are not harmful but a level above about 4 percent represents a real economic disadvantage.

Strangely enough we have found no catalyst other than dicumyl peroxide that can be successfully included in the composition; either less active or more active catalysts have a definite harmful effect on the resultant bond.

The substrate to be employed in making the final laminate usually comprises a fibrous mat web or woven fabric impregnated with a catalyzed thermosetting resin which has the desired electrical properties for the production of optimum composite boards. Optionally, however, the substrate can consist of molding powders consisting of thermosetting resin, dicumyl peroxide catalyst, reinforcing fibers or, mineral fillers or mixtures of fibers and fillers.

Best results are obtained with the diallyl esters of dibasic organic carboxylic acids such as diallyl orthophthalate diallyl isophthalate, diallyl maleate, diallyl succinate and diallyl chlorendate. These materials are generally used in the form of their prepolymers (the isolated solvent-soluble partial polymers, such as are described in U.S. Pat. No. 3,096,310). To get a satisfactory bond between the substrate and the polyphenylene oxide resin an unsaturated monomer should be included with prepolymer, from about 10 to 50 percent of the total of monomer and prepolymer. For optimum electrical properties the monomer should be an allylic monomer although the monomer can be another unsaturated material which will copolymerize with the prepolymer.

Good results are obtained with polyesters containing points of unsaturation such as those supplied by maleic and fumaric acids. They are prepared by well known means involving reacting dibasic acids with dihydroxy compounds, at least a portion of the dibasic acid component consisting of unsaturated acid. Among the preferred saturated dibasic acids are phthalic and isophthalic. Chlorendic and tetrachlorophthalic acids can be used where flame resistance is desired in the product. Other useful acids include tetrahydrophthalic, hexahydrophthalic, succinic and adipic. Useful dihydroxy compounds include linear glycols such as ethylene glycol, propylene glycol, diethylene glycol and dipropylene glycols as well as cyclohexanedimethanol and hydroxy alkyl ethers of Bisphenol A.

Since the products of this invention should be highly resistant to chemicals and elevated temperatures, we prefer to use polyesters of high maleic or fumaric content, the so-called rigid polyesters. Preferred polyesters of this type are described in a publication "Heat Resistant Diallyl Phthalate Polyesters," J. Litwin, H. H. Beacham and C. W. Johnston, 1963 SPI Technical Conference.

The combination of monomer and prepolymer or polyester should contain at least about one percent dicumyl peroxide based on the total monomer plus prepolymer or polyester. Somewhat higher levels are preferred when monomer levels are high, and up to about three percent catalyst is more than adequate for conventional conversion times; however, higher amounts of catalyst can be used, except for the obvious economic disadvantage. Here also as with polyphenylene oxide resin films we have found that dicumyl peroxide seems to be specifically needed to get proper adhesion—more active and less active catalysts both seem to reduce the adhesion to unsatisfactory levels.

The base material can be made by impregnating a fibrous non-woven mat or woven fabric with a solution of the resin and monomer in a volatile solvent such as acetone, and then evaporating substantially all volatile solvent from the prepreg. Any fibrous material can be used. If desired the composition can also include antimony oxide and resins which will produce fire resistant compositions in known manner. Inert low-cost mineral fillers such as calcium carbonate, calcium silicate, clay, silica and the like may be added to the resin system to reduce costs. Furthermore, where the monomer-polymer mixture is sufficiently liquid, as is usually the case with monomer and unsaturated polyester systems, the solvent can be eliminated and a conventional wet lay-up method used. In this manner, the fibrous material can be saturated with resin just prior to lamination simply by pouring on of resin, and the subsequent pressing with treated copper foil serves to distribute the resins evenly. Mineral fillers are frequently used in the wet lay-up system to reduce costs and improve dimensional stability. The use of glass coupling agents, such as unsaturated silanes, in the base is preferred to obtain optimum mechanical and strength properties of the base. However, the invention is not limited to compositions containing glass coupling agents.

The saturated treated base materials are then placed in a laminating press, preferably in the manner shown in the drawing, between two sheets of coated copper and pressed at relatively low pressures, of the order of 50 to 200 p.s.i., and heated for long enough to cure the resin. A typical slow cycle consists of laying the pieces together for one-half hour at 80° C. at contact pressure and then to 120° C. at 150 p.s.i. for one-half hour and one hour at 160° C. at 150 p.s.i. A typical fast cycle would be one-half hour at 160° C. at 150 p.s.i.

If desired, substantially higher pressures can be used. We have operated as high as 2500 p.s.i. in a matched die compression mold but the adhesion was no better at these pressures than at 150 p.s.i. Alternatively other conventional laminating techniques, such as vacuum bag lamination at pressures as low as about 15 p.s.i.a., can be used. The temperatures used in the molding can be varied over a wide range from as low as 80° C. to as high as 180° C.

For printed circuit boards prepared from molding compounds the copper cladding is coated as for use with cloth or mats. The filled resin substrate is prepared by conventional means except that dicumy peoxide should be used as the curing agent and monomer content of the resin portion of the molding compound should be from about 10 to 50 percent. Typically a molded board is prepared by placing a layer of copper treated with polyphenylene oxide resin with the treated side up in the bottom of a molding cavity. Molding compound is then placed on top of the copper in an amount required to give the desired thickness. If desired, a second layer of treated copper is placed on top of the molding compound. The molding cavity is closed and subjected to the required temperature and pressure to cause the compound to conform to the mold and cure. Metal inserts, irregular shapes and holes may be molded into the board during this operation.

In addition to the allylic resins, we have operated with unsaturated polyester resins and have obtained similar results. Polyester resin compositions should contain from about 10 to 50 percent monomer as in the case of allylics. Since the unsaturated polyester copolymerizes with a wider range of monomers than the allylics, the choice of monomers is increased. Among the monomers which we have successfully used are the following: dallyl phthalate, diallyl isophthalate, diallyl chlorendate, triallyl cyanurate, styrene, divinyl benzene, vinyl toluene and methyl methacrylate.

The peel test for copper foil board is conducted according to those set forth in NEMA Standards LII–1965, part 10, and Military Specification MIL–P–13949C for plastic sheet, laminated, copper-clad. All electrical tests were also conducted according to the above standards.

PREFERRED EMBODIMENTS OF THE INVENTION

The following are typical examples of the invention: All parts and percentages in the examples and claims are by weight.

EXAMPLE 1

Ten parts of polyphenylene oxide resin powder (General Electric Co., Grade 631–101) and 0.2 part dicumyl peroxide (Hercules Di-Cup R) were dissolved in a mixture of 100 parts trichloroethylene and 10 parts xylene. This solution was roller coated onto one-ounce copper foil [1]; a standard copper used in the preparation of printed circuit boards, to form a film thickness of 0.4 mil after removal of solvent. The coated copper film was baked in a circulating air oven for one-half hour at a temperature of 150° C.

A saturating solution was prepared containing the following:

| | Parts |
|---|---|
| Dapon M. resin (diallyl isophthalate prepolymer) | 800 |
| Diallyl isophthalate monomer | 200 |
| Di-Cup R | 30 |
| A–174 silane coupling agent* (carbide and carbon) | 10 |
| Hydroquinone | 0.01 |
| Acetone | 1700 |

*Gamma methacryloxypropyl-trimethoxysilane.

Glass fabric (Hess Goldsmith, HG–30 cloth with I550 finish) was passed through the above solution, then air dried 48 hours to remove acetone solvent. The impregnated cloth was cut to 9" x 12" sections and nine plies stacked to make a one-sixteenth inch laminate. A 9" x 12" piece of coated copper was placed on the stack, coated side next to the preimpregnated cloth stack and the stack placed in a laminating press with platens heated to 160° C. A pressure of 150 p.s.i. was applied for 30 minutes. At the end of the cure the laminate was removed from the press and allowed to cool to room temperature. Peel strength of the copper foil following etching with ammonium persulfate was a minimum of 12 pounds per inch width. This bonding strength was retained essentially unchanged after 30 seconds immersion in a solder bath at 260° C. Surface resistance of the etched sample after 160 hours at 60° C. and 95 percent relative humidity was $1.5\times10^{10}$ ohms; volume resistivity was $1.0\times10^{14}$ ohm cm.

A laminate prepared from copper foil without treatment with the polyphenylene oxide coating exhibited a peel strength of only two pounds per inch width.

EXAMPLE 2

Example 1 was repeated except that the solution used for coating of the copper foil was composed of a more soluble form of polyphenylene oxide, namely "Noryl" supplied by General Electric Co. as black pellets and no dicumyl peroxide was used in the coating. Results were essentially the same as in Example 1.

[1] (One-ounce per square foot.)

EXAMPLE 3

Example 2 was repeated but this time the saturating solution consisted of:

| | Parts |
|---|---|
| Dapon 35 resin (diallyl orthophthalate prepolymer) | 800 |
| Diallyl phthalate monomer | 200 |
| Di-Cup R | 30 |
| A–174 silane coupling agent | 10 |
| Acetone | 1500 |

The laminate consisting of nine plies of saturated glass cloth and two layers of coated copper foil was prepared in a laminating press using the following laminating cycle·

½ hour at 80° C. at contact pressure
½ hour at 120° C. at 150 p.s.i.
1 hour at 160° C. at 150 p.s.i.

The cooled laminate exhibited a minimum of 10 pounds per inch of width in the peel test after etching. Electrical characteristics were essentially the same as in Example 1. However, bond strength on immersion in hot solder was maintained for only 10 to 15 seconds.

EXAMPLE 4

A molding compound was prepared as follows:

| A solution consisting of: | Parts |
|---|---|
| Dapon M prepolymer | 850 |
| Diallyl isophthalate monomer | 150 |
| Di-Cup R | 30 |
| A–174 silane coupling agent | 10 |
| Acetone | 1000 |

was prepared by agitation in a sigma blade mixer. After solution was achieved, 1000 grams of quarter inch glass strands (Ferro Corp., HI type) were added and mixing continued until the glass was thoroughly wetted. The mass was then removed from the mixer, spread on trays in layers about two inches in thickness and air dried overnight.

For preparation of a copper-clad laminate, a four inch diameter disc of the coated copper foil of Example 1 was placed in the bottom of a matched metal four-inch disc cavity mold heated to 150° C., coated side up. Sixty grams of the dried molding compound was placed on top of the copper and a second disc of coated copper arranged atop the molding compound. The mold was closed in a press and held under a pressure of 500 p.s.i. for 10 minutes. The cured laminate, one-eighth inch in thickness and clad on both sides with copper, when cooled to room temperature, exhibited a uniform peel strength of 10 pounds per inch of width. This was retained after 30 seconds immersion in hot solder.

EXAMPLE 5

A polyester was prepared by cooking equimolar portions of isophthalic acid and maleic anhydride with a ten percent molar excess of diethylene glycol until an acid value of 25 was achieved. Sixty-five parts of the cooled polyester was dissolved in 35 parts of styrene and then three parts Di-Cup R catalyst and one part A–174 coupling agent added to the solution. Fifteen parts of Wollastonite filler (Cab-O-Lite P–1) was stirred into the resin syrup to form a thick but pourable paste.

Three plies of glass mat (Owens Corning M–8620 Mat) were cut to fit an 8" x 8" mold cavity. An 8" square of treated copper of Example 2 was placed in the bottom of the heated (150° C.) cavity followed by alternating layers of glass mat and filled polyester syrup. A layer of treated copper was placed on top and the mold closed and held at 150° C. and 300 p.s.i. for 15 minutes. When removed from the mold and cooled the etched specimen exhibited a peel strength of 10 pounds per inch width which was retained after ten seconds immersion in solder at 260° C. Surface resistance of the etched board was $3.7 \times 10^8$ ohms after 168 hours exposure at 60° C. and 95 percent relative humidity.

Each of the examples was converted to printed circuits by applying a standard resist and exposing it through a negative and, after exposure, etching in conventional method with either ammonia persulfate or ferric chloride, and in each case the films showed excellent adhesion to the substrate and resistance to the necessary soldering operation.

EXAMPLE 6

Example 5 was repeated except that a commercially available uncut chlorendic acid type polyester resin, Hetron 19, available from Hooker-Durez, was substituted for the polyester resin of Example 5. Results were substantially the same except that a high level of flame resistance was also exhibited.

EXAMPLE 7

Example 5 was repeated except that a commercially available uncut isophthalic type polyester resin, Dion 6421, available from Diamond Alkali, was substituted for the polyester resin of Example 5.

EXAMPLE 8

Example 3 was repeated using the following saturating solution:

| | Parts |
|---|---|
| Diallyl orthophthalate prepolymer | 750 |
| Diallyl phthalate monomer | 100 |
| Diallyl chlorendate monomer | 150 |
| Dicumyl peroxide | 30 |
| A-174 silane coupling agent | 10 |
| Acetone | 1500 |
| Antimony oxide | 150 |

The laminate was laid up and cured as in Example 2 and when cooled the laminate exhibited a minimum of 10 pounds per inch of width in the peel test after etching. Electrical characteristics were essentially the same as in Example 1. However, bond strength on immersion in 260° C. hot solder was only maintained for about 5 seconds.

EXAMPLE 9

Example 3 was repeated using the following saturating solution:

| | Parts |
|---|---|
| Diallyl orthophthalate prepolymer | 750 |
| Diallyl phthalate monomer | 150 |
| Triallyl cyanurate monomer | 100 |
| Dicumyl peroxide | 30 |
| A-174 silane coupling agent | 10 |
| Acetone | 1500 |

The laminate was prepared as in Example 3 and after cooling the laminate exhibited a minimum of 9 pounds per inch of width in the peel test after etching. Electrical characteristics were essentially the same as in Example 1. However, bond strength on immersion in hot solder was maintained for only 9-11 seconds.

EXAMPLE 10

Example 7 was repeated except that 50 parts of the isophthalic acid polyester was dissolved in a mixture of 30 parts of diallyl phthalate monomer and 20 parts of triallyl cyanurate monomer. The laminate was prepared as in Example 7 and after cooling and etching the specimen exhibited a peel strength of 5 pounds per inch of width which was retained after 7 seconds immersion in solder at 260° C. The electrical properties were essentially the same as those obtained in Example 7.

EXAMPLE 11

Example 7 was repeated a number of times substituting different monomers for styrene. The polyester resin and monomer levels and the data obtained on the specimen after molding are container in Table I. The laminates were prepared and tested according to the procedure outlined in Example 7.

TABLE I

| | Percent isophthalic type polyester resin | Percent monomer | Peel strength lbs./in. | 260°C. solder test, seconds (1) |
|---|---|---|---|---|
| a | 50 | 50% diallyl phthalate monomer. | 9-11 | 5 |
| b | 50 | 50% diallyl isophthalate monomer. | 6-7 | 10 |
| c | 65 | 35% methyl methacrylate monomer. | 4-5 | 7 |
| d | 65 | 35% divinyl qenzene monomer. | 7 | 10 |
| e | 50 | 30% diallyl phthalate monomer, 20% triallyl cyanurate monomer. | 5 | 7 |
| f | 50 | 20% diallyl chlorendate monomer, 30% diallyl phthalate monomer. | 8-10 | 6 |
| g | 40 | 60% of a 25 to 75 solution of diallyl phthalate prepolymer in diallyl phthalate monomer. | 9-11 | 7 |

[1] Time to cause blistering or delamination.

As will be apparent to those skilled in the art, numerous modifications and variations of the embodiments illustrated above may be made without departing from the spirit of the invention or the scope of the following claims.

What is claimed is:

1. A method of producing a copper-clad laminate comprising coating a copper sheet with a thin film of a polyphenylene oxide resin, heating the coated copper to a temperature between 100° C-170° C. for from 5 to 30 minutes, laminating the coated copper at a temperature of at least 80° C. to a base comprising a reinforcing material and a thermosetting polymer selected from the group consisting of polymers of diallyl esters of dibasic organic carboxylic acids and unsaturated polyester polymers, 10 to 50% of a monomer which copolymerizes with the polymer and dicumyl peroxide catalyst in sufficient amount to convert the polymer-monomer mixture to the cured state at the laminating temperature.

2. The method for producing copper-clad laminates according to claim 1 in which dicumyl peroxide catalyst is admixed in the polyphenylene oxide resin used to coat the copper sheet.

3. A copper-clad laminate comprising a copper sheet coated with a thin film of a polyphenylene oxide resin, said coated copper sheet having been heated in the presence of air or dicumyl peroxide catalyst for 5 to 30 minutes at a temperature between 100° C. and 170° C., said polyphenylene oxide surface being laminated at a temperature of at least 80° C. to a base comprising a reinforcing material and a thermosetting polymer, selected from the group consisting of diallyl esters of dibasic organic carboxylic acids and unsaturated polyester polymers, mixed with 10 to 50% by weight, based on the weight of the polymer, of a monomer which copolymerizes with the polymer and dicumyl peroxide catalyst in sufficient amount to convert the polymer-monomer mixture to the cured state at the laminating temperature.

4. The copper-clad laminate as recited in claim 3 in which the reinforcing material for the thermosetting polymer-monomer mixture is selected from the group consisting of non-woven fibrous mats, woven fabrics, fibers and inert, finely ground mineral fillers.

5. The copper-clad laminate as recited in claim 3 in which the thermosetting polymer is a diallyl orthophthalate polymer.

6. The copper-clad laminate as recited in claim 3 in which the thermosetting polymer is a diallyl isophthalate polymer.

References Cited

UNITED STATES PATENTS

| | | | |
|---|---|---|---|
| 2,965,532 | 12/1960 | Taylor | 161—231 XR |
| 3,134,753 | 5/1964 | Kwiatek | 260—47 |
| 3,149,021 | 11/1964 | Goepfert | 161—214 |
| 3,300,544 | 1/1967 | Parker | 260—861 |
| 3,306,874 | 2/1967 | Hay | 260—47 |
| 3,306,875 | 2/1967 | Hay | 260—47 |
| 3,382,212 | 5/1968 | Price | 260—47 |

OTHER REFERENCES

Hercules Powder Co., Product Data, Nov. 21, 1958.

JOHN T. GOOLKASIAN, Primary Examiner

J. D. SMITH, Assistant Examiner

U.S. Cl. X.R.

117—132; 156—327; 161—88, 93, 151, 156, 162, 213, 233, 256

UNITED STATES PATENT OFFICE
CERTIFICATE OF CORRECTION

Patent No. 3,527,665 Dated September 8, 1970

Inventor(s) Carl L. Wright and Harry H. Beacham

It is certified that error appears in the above-identified patent and that said Letters Patent are hereby corrected as shown below:

Column 3, line 36, "ate diallyl" should read --ate, diallyl--.

Column 4, line 55, "peoxide" should read --peroxide--.

Column 5, line 2, "dallyl" should read --diallyl--.

Column 5, move footnote from end of Example 2 to line 27 of Example 1.

Column 8, line 2, "container" should read --contained--.

Column 8, line 17, "qenzene" should read --benzene--.

Signed and sealed this 19th day of October 1971.

(SEAL)
Attest:

| | |
|---|---|
| **EDWARD M.FLETCHER,JR.** | **ROBERT GOTTSCHALK** |
| **Attesting Officer** | **Acting Commissioner of Patents** |